United States Patent
Yoon et al.

(10) Patent No.: US 8,042,593 B2
(45) Date of Patent: Oct. 25, 2011

(54) SEMICONDUCTOR CHIP BONDING APPARATUS

(75) Inventors: Cheal-Sang Yoon, Cheonan-si (KR);
Yong-Dae Ha, Asan-si (KR);
Jae-Ryoung Lee, Asan-si (KR);
Jeong-Soon Cho, Cheonan-si (KR);
Bum-Woo Lee, Asan-si (KR); Pil-June Kim, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 435 days.

(21) Appl. No.: 12/174,771

(22) Filed: Jul. 17, 2008

(65) Prior Publication Data
US 2009/0020229 A1    Jan. 22, 2009

(30) Foreign Application Priority Data
Jul. 20, 2007   (KR) .................. 10-2007-0073095

(51) Int. Cl.
*B32B 37/00* (2006.01)

(52) U.S. Cl. .................. 156/581; 156/580; 100/258 R
(58) Field of Classification Search .................. 156/580, 156/581, 583.1; 100/258 R, 258 A
See application file for complete search history.

(56) References Cited

U.S. PATENT DOCUMENTS

| | | | | |
|---|---|---|---|---|
| 4,797,994 A | * | 1/1989 | Michaud et al. | 29/720 |
| 5,667,628 A | * | 9/1997 | Kim | 156/581 |
| 7,021,208 B2 | * | 4/2006 | Du et al. | 100/269.12 |
| 2006/0048381 A1 | | 3/2006 | Woo et al. | |

FOREIGN PATENT DOCUMENTS

| | | |
|---|---|---|
| JP | 11-238786 | 8/1999 |
| KR | 2002-18795 | 3/2002 |
| KR | 10-546419 | 1/2006 |

* cited by examiner

*Primary Examiner* — James Sells
(74) *Attorney, Agent, or Firm* — Stanzione & Kim, LLP

(57) ABSTRACT

A semiconductor chip bonding apparatus maintains a semiconductor chip in a parallel state with respect to a lead frame when applying a bonding load.

18 Claims, 12 Drawing Sheets

SEMICONDUCTOR CHIP BONDING APPARATUS

CROSS-REFERENCE TO RELATED APPLICATIONS

This U.S. non-provisional patent application claims priority under 35 U.S.C. §119 of Korean Patent Application No. 2007-73095, filed on Jul. 20, 2007, the entire contents of which are herein incorporated by reference in their entirety

BACKGROUND OF THE INVENTION

1. Field of the Invention

The present general inventive concept relates to a semiconductor chip bonding apparatus, and more particularly, to an apparatus to bond a semiconductor chip on a lead frame or a substrate such as a PCB.

2. Description of the Related Art

Semiconductor devices are generally formed by a fabrication (FAB) process which forms electrical circuits on a silicon wafer, an electrical die sorting (EDS) process which tests electrical characteristics of semiconductor devices formed using a fabrication process, and a package process which encapsulates semiconductor devices with synthetic resins and individualizes semiconductor devices.

The package process of a semiconductor chip includes a sawing process which cuts a silicon wafer including circuits of a fine pattern into a chip unit of a predetermined size, a die bonding process which attaches chips to a lead frame, a wire bonding process which electrically connects chips to a lead frame using a conductive wire, a mold process which protects a conductive wire and chips from an external environment, and a forming process which bends an external lead of a lead frame into a predetermined shape.

The sawing process is a process which separates a wafer adhering to a tape into a chip unit of predetermined size using a diamond cutter. As a result of the sawing process, chips of the chip unit including circuits of a fine pattern are provided. The chips separated from the wafer by the sawing process are arranged and transferred to the lead frame. An adhesive such as epoxy spreads on the lead frame and the chips adhere to the lead frame by the adhesive. The chips are pressurized by a bonding load of a die bonder to fixedly adhere to the lead frame.

SUMMARY OF THE INVENTION

The present general inventive concept provides an apparatus to bond a semiconductor chip to a lead frame or a circuit board.

Additional aspects and utilities of the present general inventive concept will be set forth in part in the description which follows and, in part, will be obvious from the description, or may be learned by practice of the general inventive concept.

The foregoing and other aspects and utilities of the present general inventive concept may be achieved by providing a semiconductor chip bonding apparatus, including a bond head unit to apply a bonding load, a chip holding unit to hold a semiconductor chip to be attached to a substrate, and a balance control unit to transfer the bonding load of the bond head unit to the chip holding unit and to move the chip holding unit such that the chip holding unit is balanced to the substrate.

The foregoing and other aspects and utilities of the present general inventive concept may also be achieved by providing a semiconductor chip bonding apparatus, including a bond head unit having a plurality of bond head shafts to apply a bonding load, chip holding units to hold semiconductor chips to be attached to a substrate and to correspond to the respective bond head shafts, and balance control units to transfer the bonding load between the corresponding bond head shaft and the chip holding unit and to move the chip holding unit such that the chip holding unit is balanced to the substrate.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
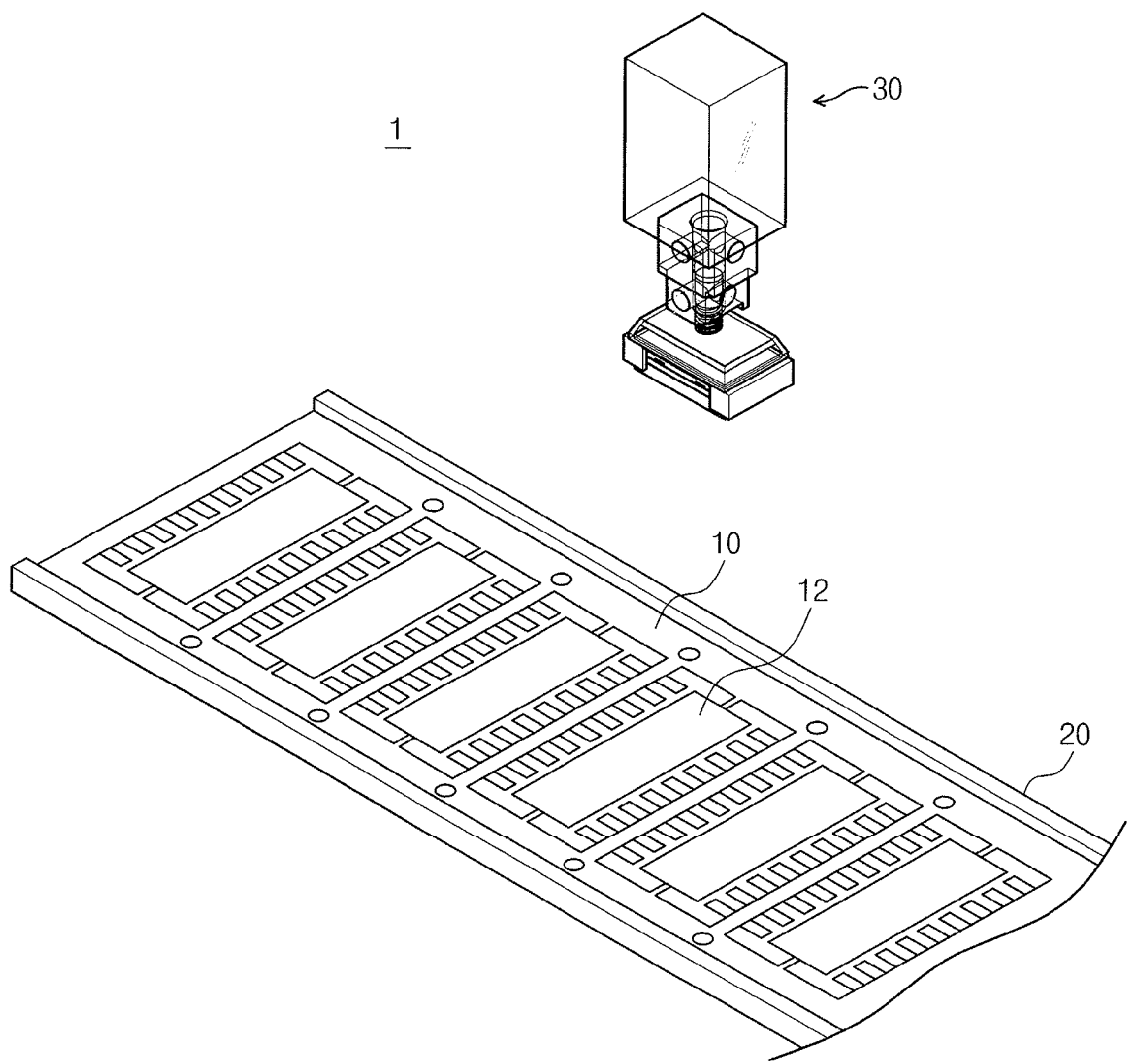
FIG. 1 is a schematic view illustrating a bonding apparatus including a semiconductor chip bonding apparatus according to the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. The present general inventive concept may, however, be embodied in many different forms and should not be construed as limited to the embodiments set forth herein. Rather, these embodiments are provided so that this disclosure will be thorough and complete, and will fully convey the scope of the general inventive concept to those skilled in the art.

In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/ layer, and, similarly, a second region/layer could be termed a first region/layer without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are schematic illustrations of idealized embodiments of the present general inventive concept. As such, variations from the shapes of the illustrations, as a result, for example, of manufacturing techniques and/or tolerances, are to be expected. Thus, embodiments of the present general inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 is a schematic view illustrating a bonding apparatus 1 including a semiconductor chip bonding apparatus 30 according to an embodiment of the present general inventive concept.

A wafer is provided by a fabrication process and an electrical die sorting process and is cut into a semiconductor chip unit by a sawing process. The semiconductor chip unit is individually separated from the wafer, arranged and then transferred to a lead frame 10 by a chip transfer device (not illustrated).

The lead frame 10 is provided as a strip shape such that a plurality of semiconductor chips may be bonded sequentially on the lead frame 10. The lead frame 10 is provided from a lead frame supplier (not illustrated) and is moved in a direction along a transfer rail 20. An adhesive such as epoxy spreads on a chip pad 12 of the lead frame 10.

The semiconductor chip to be transferred to the lead frame 10 is transferred to the semiconductor chip bonding apparatus 30. The semiconductor chip bonding apparatus 30 transfers a semiconductor chip to the chip pad 12 of the lead frame 10 and applies a bonding load to the semiconductor chip, so that the semiconductor chip is bonded on the chip pad 12 of the lead frame 10.

The semiconductor chip is bonded to the chip pad 12 by an adhesive which spreads on the chip pad 12. The present general inventive concept provides parallelism between the semiconductor chip and the chip pad 12. If parallelism is not maintained between the semiconductor chip and the chip pad 12, the bonding load is concentrated where the semiconductor chip is first in contact with the chip pad 12 during a bonding process, thereby damaging the semiconductor chip. If parallelism is not maintained between the semiconductor chip and the chip pad 12 after a bonding process is completed, an abnormal process may occur in a subsequent process such as a wire bonding process.

Accordingly, the present general inventive concept provides the semiconductor chip bonding apparatus 30 to maintain parallelism between the semiconductor chip and the lead frame 10, and to bond the semiconductor chip on the lead frame 10 in such a state.

If the bonding load is applied to the semiconductor chip when the semiconductor chip is not disposed parallel to the chip pad 12 but has an angle with the chip pad 12, a bonding state between the semiconductor chip and the chip pad 12 cannot be uniform. That is, a major portion of the bonding load is applied to portions of the semiconductor chip and the chip pad 12 where the portions of the semiconductor chip and the chip pad 12 are disposed apart from each other by a first distance, and a minor portion of the bonding load is applied to other portions of the semiconductor chip and the chip pad 12 where the other portions of the semiconductor chip and the chip pad 12 are disposed apart from each other by a second distance longer than the first distance. A first bonding state of the portions of the semiconductor chip and the chip pad 12 becomes different from a second bonding state of the other portions of the semiconductor chip and the chip pad 12. Therefore, a bonding state between the semiconductor chip and the chip pad 12 cannot be uniform.

Figure 2:
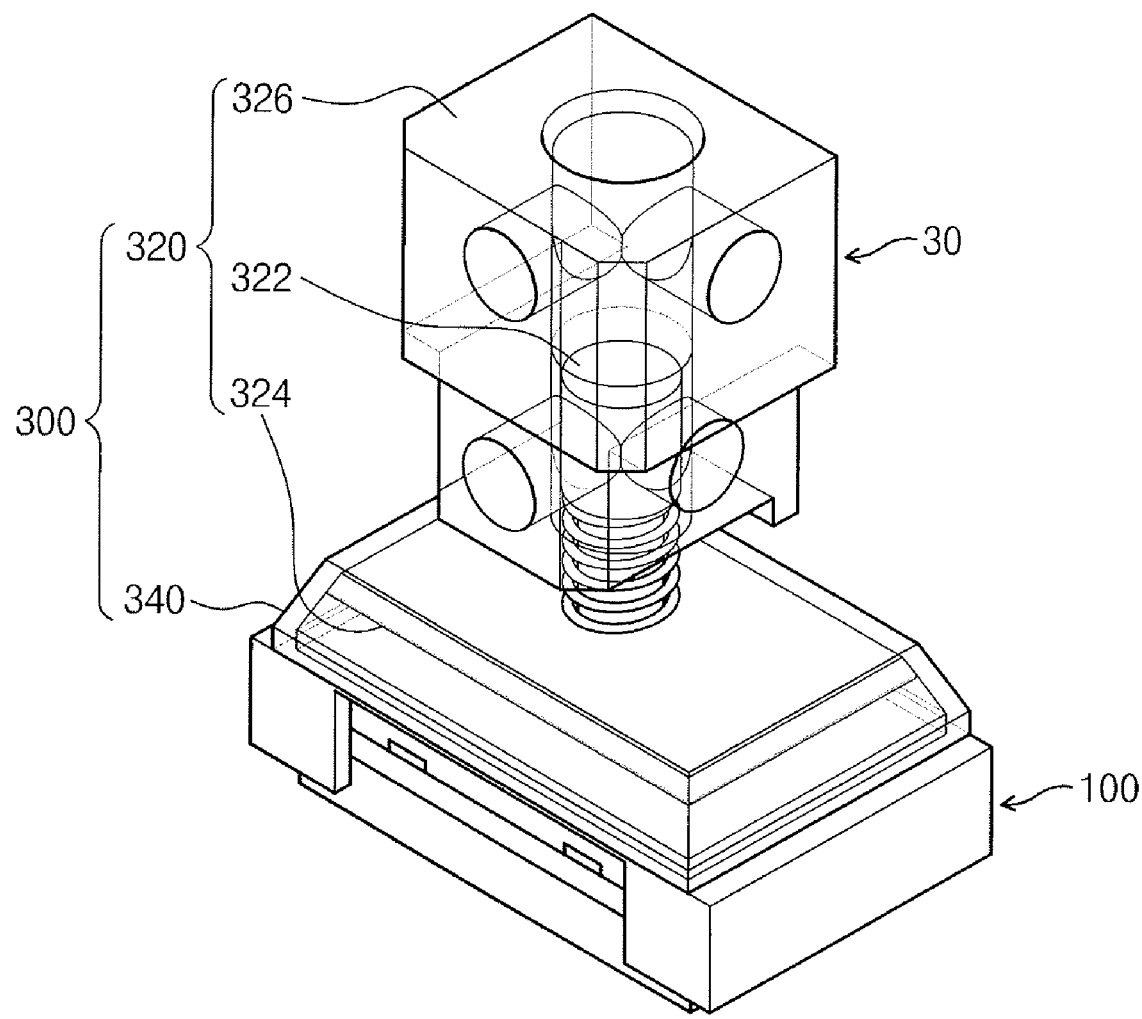
FIG. 2 is a perspective view illustrating the semiconductor chip bonding apparatus of FIG. 1.
Figure 3:
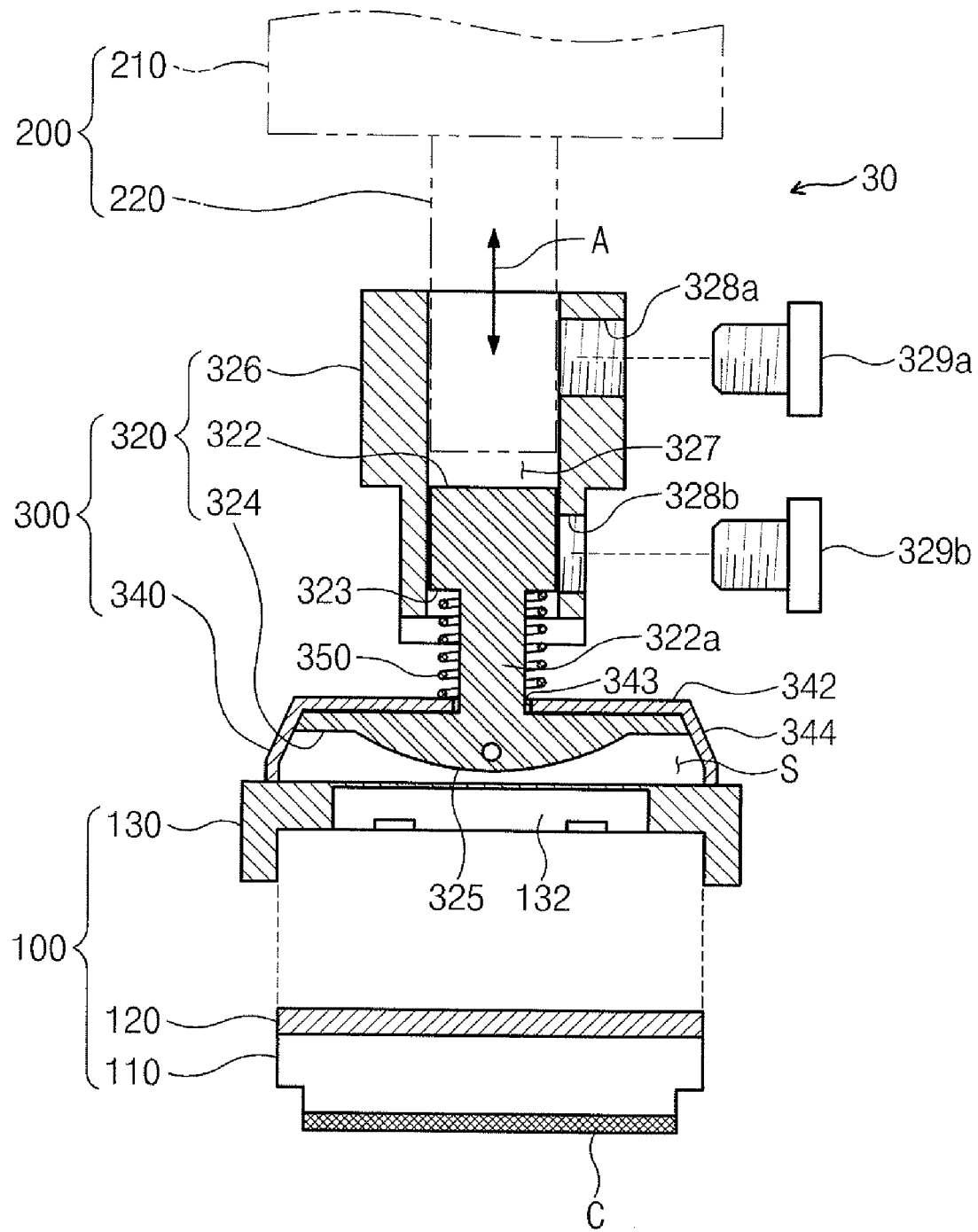
FIG. 3 is a cross sectional view illustrating the semiconductor chip bonding apparatus of FIG. 2.

FIG. 2 is a perspective view illustrating the semiconductor chip bonding apparatus 30 of FIG. 1, and FIG. 3 is a cross sectional view illustrating the semiconductor chip bonding apparatus 30 of FIG. 2.

Referring to FIGS. 2 and 3, the semiconductor chip bonding apparatus 30 includes a chip holding unit 100, a bond head unit 200 and a balance control unit 300. The chip holding unit 100 holds a semiconductor chip C to be bonded on the lead frame 10 of FIG. 1. The bond head unit 200 is connected to the chip holding unit 100 through the balance control unit 300. The bond head unit 200 applies a bonding load to be transferred to the chip holding unit 100 through the balance control unit 300. The balance control unit 300 transfers the bonding load of the bond head unit 200 to the chip holding unit 100 and controls the chip holding unit 100 to maintain parallelism between the chip holding unit 100 and the lead frame 10.

The parallelism may be referred to a state where the semiconductor chip C and the lead frame 10 are disposed parallel to each other. When the semiconductor chip C is not disposed parallel to the lead frame 10, or when the lead frame 10 is not disposed parallel to a major surface of the semiconductor chip C but inclined to have an angle with respect to the major surface of the semiconductor chip C, the balance control unit 300 controls the chip holding unit 100 to be disposed parallel to the lead frame 10 such that the bonding load is applied to the semiconductor chip C in a direction perpendicular to the major surface of the semiconductor chip C.

The chip holding unit 100 includes a collet 110 which absorbs and fixes the semiconductor chip C thereto. A metal plate 120 is coupled with an upper portion of the collet 110. A lower portion of the collet 110 is made of material which does not generate a static electricity, such as a non-conductive rubber, silicon or urethane. A vacuum line (not illustrated) is formed inside of the collet 110 to absorb gas or air around the semiconductor chip C to generate a vacuum state between the semiconductor chip C and the collet 110 to attach the semiconductor chip C to the collet 110. A bottom surface of the collet 110 may have a cross section corresponding to a cross section of the semiconductor chip C. The collet 110 is fixed to a collet holder 130. The collet holder 130 includes a magnetic substance 132. A magnetic force of the magnetic substance 132 acts as an attraction to the metal plate 120. As a result, the collet 110 is fixed to the collet holder 130.

The bond head unit 200 includes a bond head body 210 and a bond head shaft 220. A bond head (not illustrated) and a driving motor (not illustrated) are embedded in the bond head body 210. The bond head is connected to the bond head shaft 220. The driving motor drives the bond head to control a distance by which the bond head shaft 220 connected to the bond head travels in its axial direction A. The driving motor may control a bonding load of the head shaft 220.

The balance control unit 300 includes a load transfer member 320 and a connecting member 340. The load transfer member 320 transfers a bonding load of the bond head shaft 220 to the chip holding unit 100. The connecting member 340 connects the load transfer member 320 to the chip holding unit 100 such that the chip holding unit 100 can move relatively to the load transfer member 320 according to an upward and downward movement of the load transfer member 320 when transferring the bonding load of the bond head shaft 220. The bonding load of the bond head shaft 220 is transferred in an axial direction of the semiconductor chip bonding apparatus 30

The load transfer member 320 includes an axis member 322 and a pressure member 324 coupled with a lower portion of the axis member 322. The axis member 322 is arranged on a central axis of the bond head shaft 220 in the axial direction A and connected to the bond head shaft 220 by an axis coupling member 326. A first hole 327 is formed in the axis coupling member 326 along an axis align direction of the bond head shaft 220 and the axis member 322. The bond head shaft 220 is inserted into an upper portion of the first hole 327 and the axis member 322 is inserted into a lower portion of the first hole 327. Second holes 328a and 328b perpendicular to the first hole 327 are formed in the axis coupling member 326. The second hole 328a opens to the upper portion of the first hole 327 where the bond head shaft 220 is inserted. The second hole 328b opens to the lower portion of the first hole 327 where the axis member 322 is inserted. Screws 329a and 329b fasten the bond head shaft 220 and the axis member 322 which are inserted into the first hole 327 to the axis coupling member 326 through the second holes 328a and 328b, respectively.

The pressure member 324 is coupled with a lower portion 322a of the axis member 322 and is in contact with the chip holding unit 100 according to an upward and downward movement of the axis member 322 to apply the bonding load to the chip holding unit 100. A side 325 of the pressure member 324 is in contact with the chip holding unit 100, and the side 325 may have a rounded shape which is convex downward. If a contact side 325 of the pressure member 324 has a rounded shape which is convex downward, though the chip holding unit 100 is inclined at an arbitrary angle, the contact side 325 of the pressure member 324 is in rolling contact with the chip holding unit 100. As a result, the pressure member 324 may uniformly apply the bonding load to the chip holding unit 100 such that the bonding load is applied to the semiconductor chip C in a direction perpendicular to the surface of the semiconductor chip C and/or the lead frame 10.

The contact side 325 may have a portion disposed on the center axis in the axial direction to contact a predetermined portion (or center portion) of the collet holder 130, and a side surface extended from the portion and curved away from the center axis to contact another portion of the collet holder 130 other than the predetermined portion according to a characteristic of the external force, such that the bonding load can be applied to the semiconductor chip C in a direction perpendicular to the semiconductor chip C.

The connecting member 340 is coupled with a top surface of the collet holder 130. The connecting member 340 includes an upper wall 342 and side walls 344. The upper wall 342 includes a hole 343 where the axis member 322 is inserted. The side walls 344 extend downward from an edge of the upper wall 342 and are coupled with the collet holder 130. A predetermined space S is formed by the upper wall 342, the side walls 344 and the top surface of the collet holder 130. The pressure member 324 coupled with a lower portion of the axis member 322 is accommodated in the space S. The upper wall 342 and the side walls 344 are provided so that the pressure member 324 moves upwardly and downwardly, and the connecting member 340 is controlled to rotate according to an upward and downward movement of the pressure member 324 in the space S.

The hole 343 has a larger diameter than a diameter of the lower portion 322a of the axis member 322 to provide a space to allow the connecting member 340 to rotate with respect to the axis member 322 according to the external force transferred thereto from the lead frame 10 and/or the chip holding unit 100.

An elastic member 350 is provided to prevent the load transfer member 320 from being separated from the upper wall 342 of the connecting member 340. The elastic member 350 may be provided as a coil spring surrounding the axis member 322 of the load transfer member 320. A protrusion portion 323 of the axis member 322 and the upper wall 342 of the connecting member 340 are supported respectively by both ends of the coil spring, and the coil spring is in an initial compressed state. Since the elastic member 350 has an initial compressed state, both ends of the elastic member 350 apply an elastic force to the protrusion 323 of the axis member 322 and the upper wall 342 of the connecting member 340. When the elastic force of the elastic member 350 applies, the pressure member 324 accommodated inside of the connecting member 340 is in contact with an inside of the upper wall 342 of the connecting member 340. As a result, the pressure member 324 is prevented from being separated from the connecting member 340.

A process of bonding a semiconductor chip on a lead frame using a semiconductor chip bonding apparatus according to the present general inventive concept will be described as follows.

First, a process of bonding a semiconductor chip when a lead frame maintains a horizontal state (or a parallel state) is described with reference to FIGS. 1-4C, and then a process of bonding a semiconductor chip when a lead frame inclines at an arbitrary angle (or in a non-horizontal state or non-parallel state) is described with reference to FIGS. 1-3 and 5A-5E.

Figure 4A:
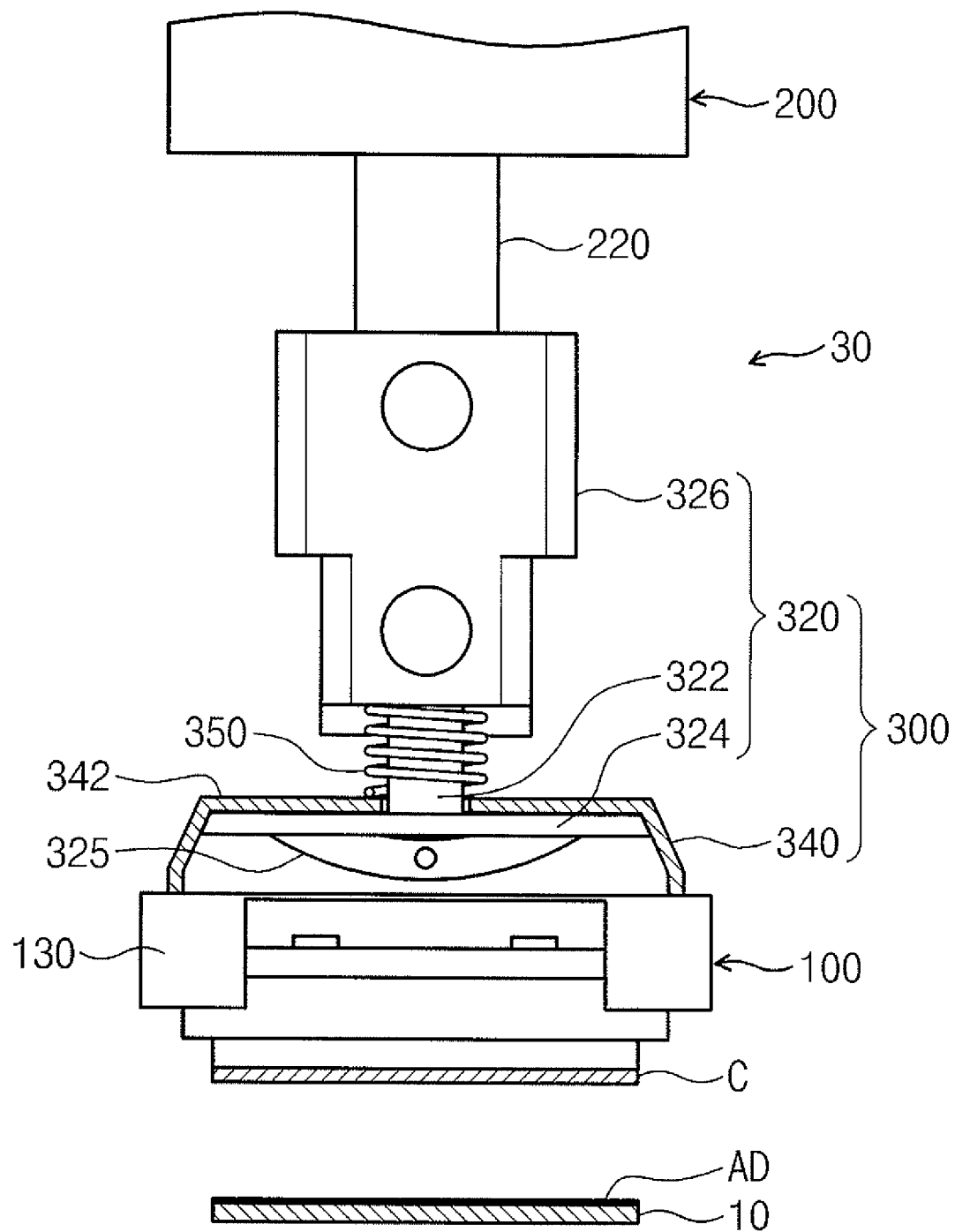
FIGS. 4A, 4B, and 4C illustrate a process of bonding a semiconductor chip on a horizontal lead frame using a semiconductor chip bonding apparatus according to the present general inventive concept.
Figure 4B:
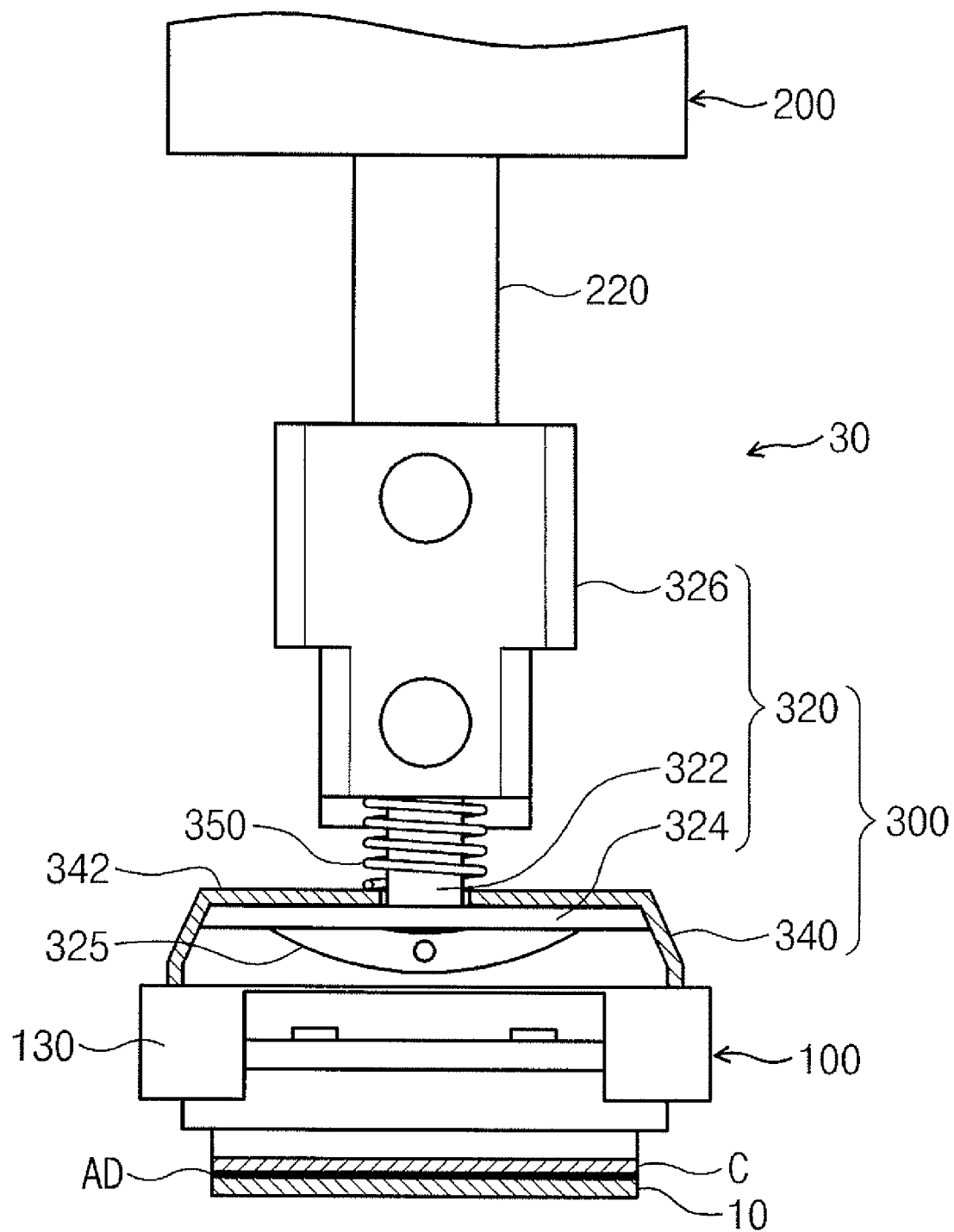
Figure 4C:
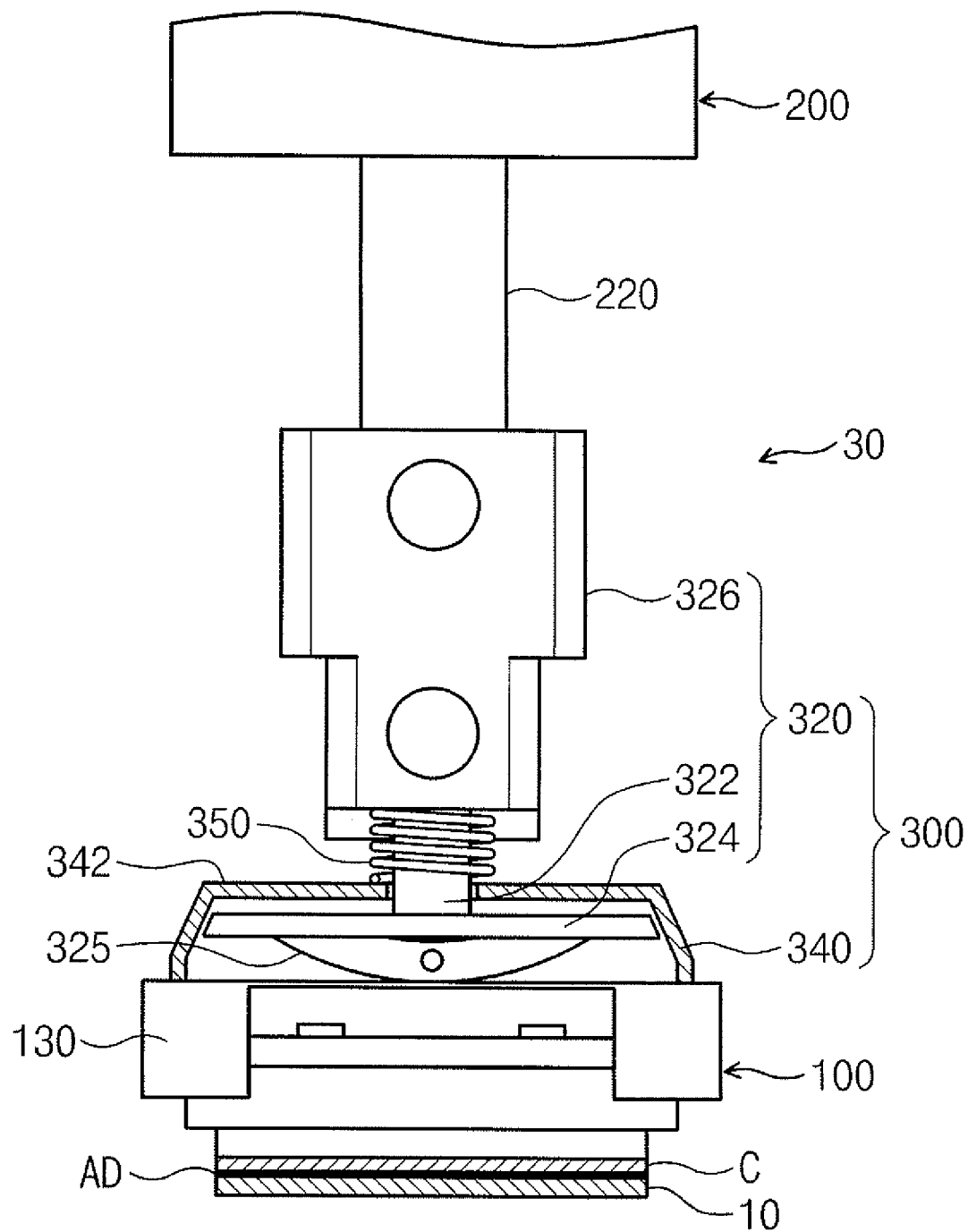

FIGS. 4A, 4B, and 4C illustrate a process of bonding a semiconductor chip on a horizontal lead frame using a semiconductor chip bonding apparatus according to the present general inventive concept.

Referring to FIG. 4A, a semiconductor chip C provided by a sawing process is individually separated from a wafer, arranged and transferred to an upper portion of a lead frame 10 by a transfer device (not illustrated). The transferred semiconductor chip C is absorbed and fixed (detachably attached) to a chip holding unit 100 of a semiconductor chip bonding apparatus. The lead frame 10 provided from a lead frame supplier (not illustrated) sequentially moves along a transfer rail 20 of FIG. 1. An adhesive AD such as epoxy spreads on a chip pad of the lead frame 10.

Referring to FIG. 4B, a driving motor (not illustrated) embedded in a bond head unit 200 drives a bond head (not illustrated) to extend a bond head shaft 220 connected to the bond head in an axial direction. Then, the chip holding unit 100 connected to the bond head shaft 220 through a balance control unit 300 moves downwardly to the lead frame 10. The bond head shaft 220 extends until the semiconductor chip C which is absorbed and fixed on the chip holding unit 100 is in contact with the lead frame 10.

Referring to FIG. 4C, the bond head shaft 220 applies bonding load in a state that the semiconductor chip C is in contact with the lead frame 10. The bonding load should be great enough to overcome an elastic force of an elastic member 350. If bonding load applies, an axis member 322 and a pressure member 324 overcome the elastic force of the elastic member 350 and move downwardly, and the pressure member 324 presses a top surface of a collet holder 130 of the chip holding unit 100. Since a top surface of the pressure member 324 is separated from an upper wall 342 of a connecting member 340, the chip holding unit 100 may move freely within a separated distance. In this state, the bond head shaft 220 continues to apply a bonding load and the bonding load is transferred to the chip holding unit 100 through the pressure member 324, so that the semiconductor chip C absorbed and fixed on the chip holding unit 100 is bonded on the lead frame 10.

Next, a process of bonding a semiconductor chip when a lead frame inclines at an arbitrary angle is described.

FIGS. 5A, 5B, 5C, 5D, and 5E illustrate a process of bonding a semiconductor chip on a lead frame which is inclined at an arbitrary angle using a semiconductor chip bonding apparatus according to the present general inventive concept.

Figure 5A:
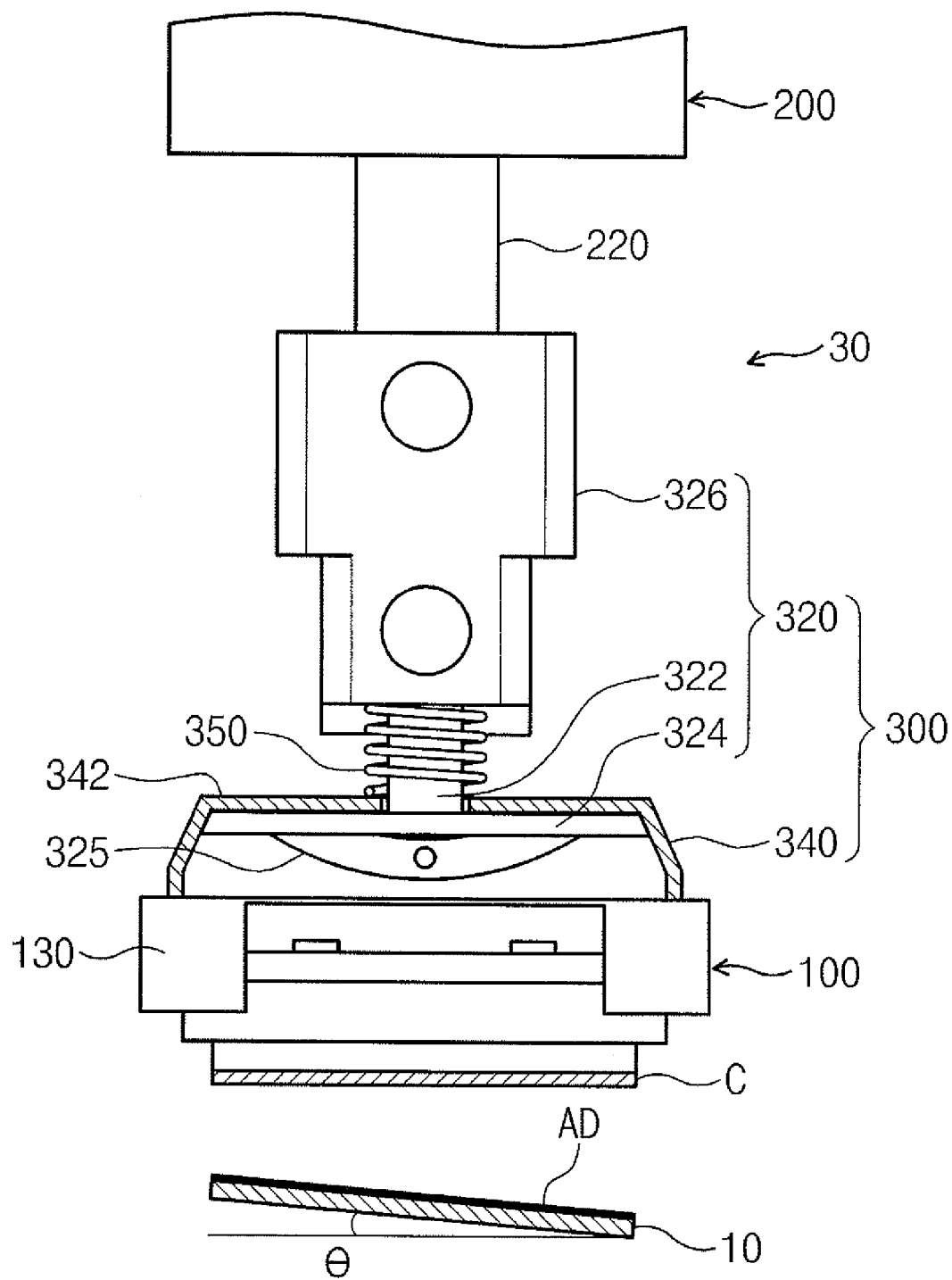
FIGS. 5A, 5B, 5C, 5D, and 5E illustrate a process of bonding a semiconductor chip on a lead frame which is inclined at an arbitrary angle using a semiconductor chip bonding apparatus according to the present inventive concept.

Referring to FIG. 5A, a semiconductor chip C provided by a sawing process is individually separated from a wafer, arranged and transferred to an upper portion of a lead frame 10 by a transfer device (not illustrated). The transferred semiconductor chip C is absorbed and fixed to a chip holding unit 100 of a semiconductor chip bonding apparatus. The lead frame 10 provided from a lead frame supplier (not illustrated) sequentially moves along a transfer rail 20 of FIG. 1. An adhesive AD such as epoxy spreads on a chip pad of the lead frame 10. Here, the lead frame 10 inclines at an arbitrary angle θ.

Figure 5B:
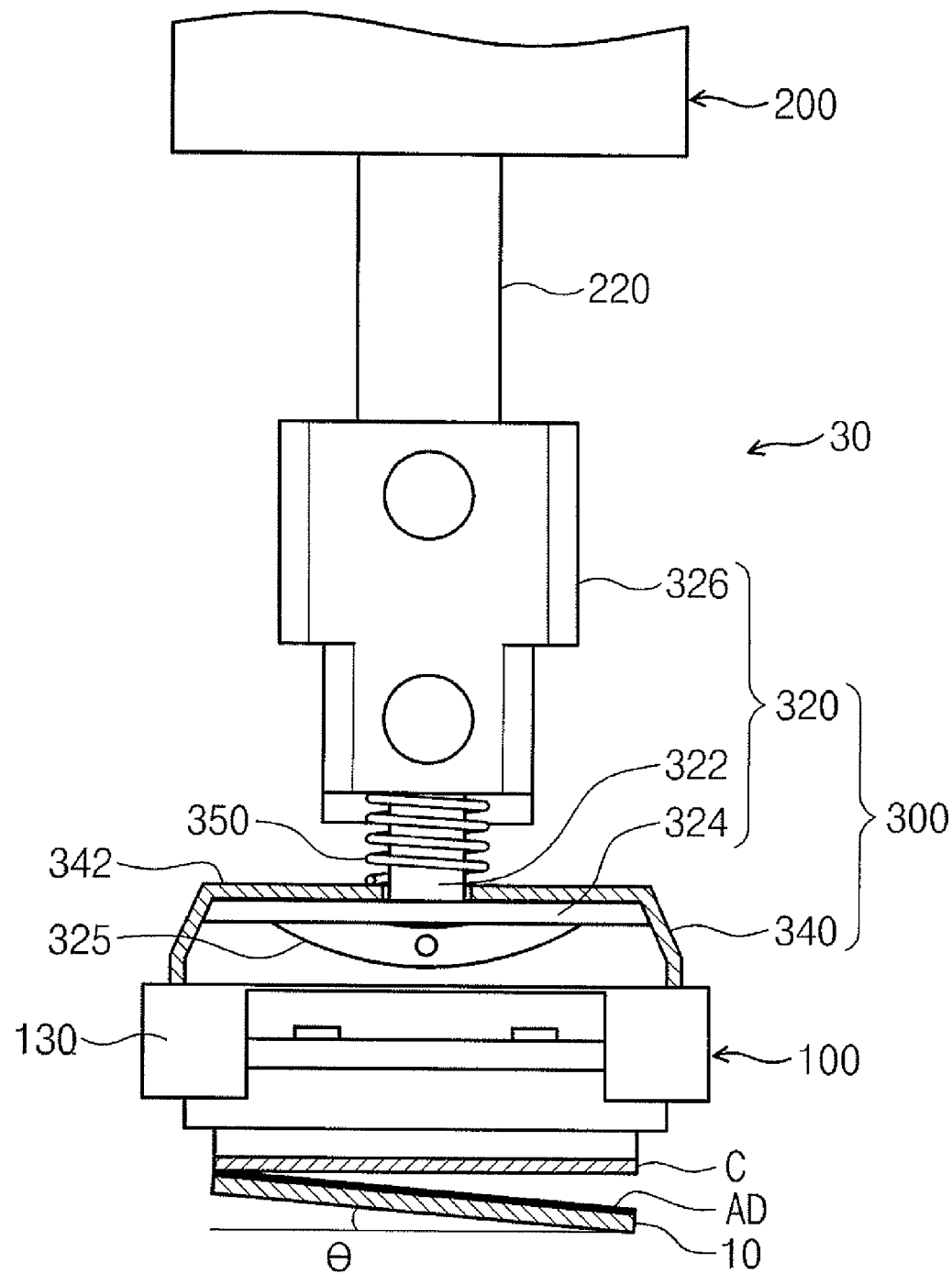

Referring to FIG. 5B, a driving motor (not illustrated) embedded in a bond head unit 200 drives a bond head (not illustrated) to extend a bond head shaft 220 connected to the bond head in an axial direction. Then, the chip holding unit 100 connected to the bond head shaft 220 moves downwardly to the lead frame 10 through a balance control unit 300. The bond head shaft 220 extends until the semiconductor chip which is absorbed and fixed on the chip holding unit 100 is in contact with the inclined lead frame 10.

Figure 5C:
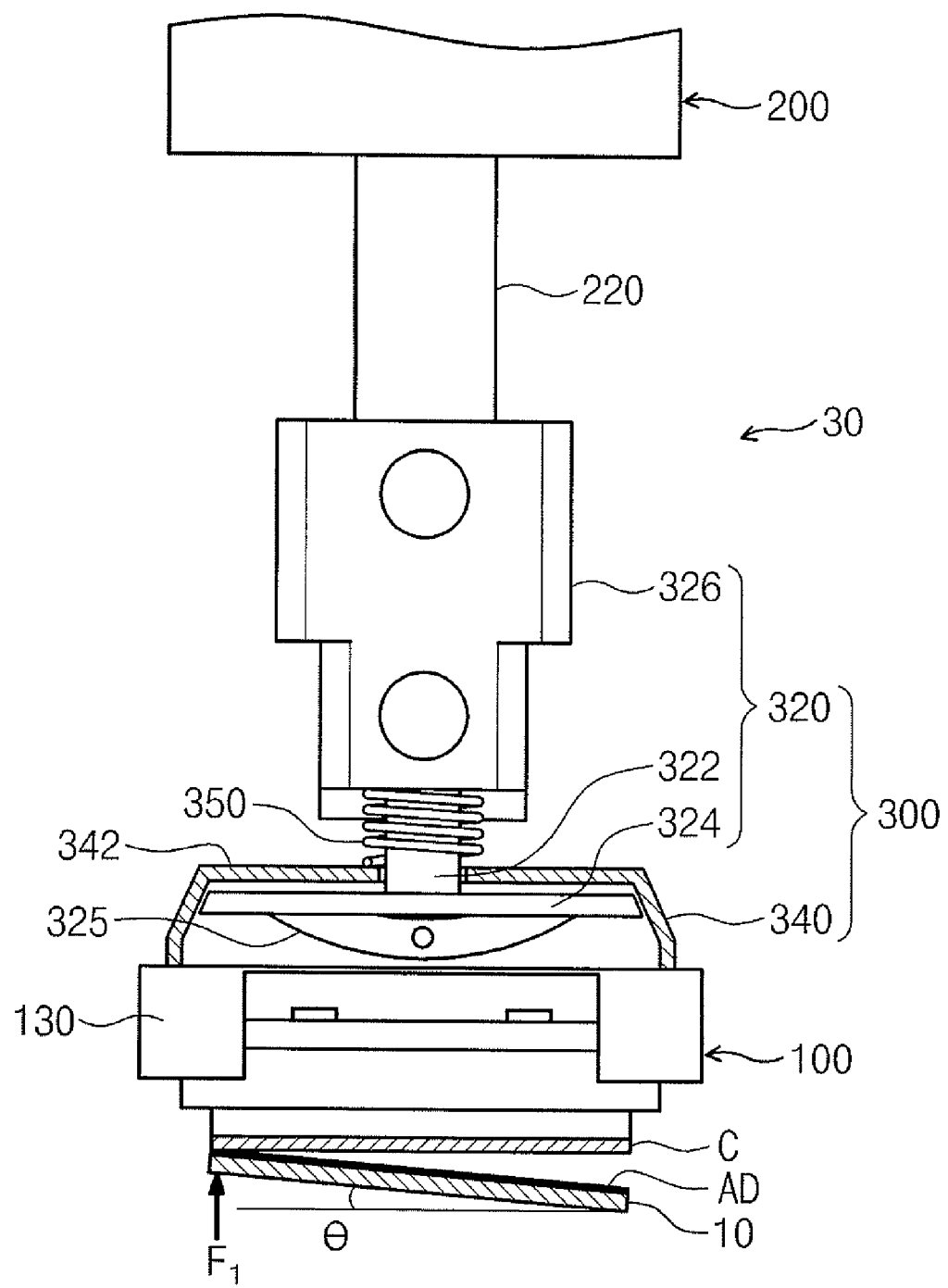

Referring to FIG. 5C, the bond head shaft 220 applies bonding load in a state that the semiconductor chip C is in contact with the lead frame 10. If bonding load applies, a pressure member 324 is spaced apart from an upper wall 342 of a connecting member 340 and maintains a state of being spaced apart from an upper surface of a collet holder 130.

Figure 5D:
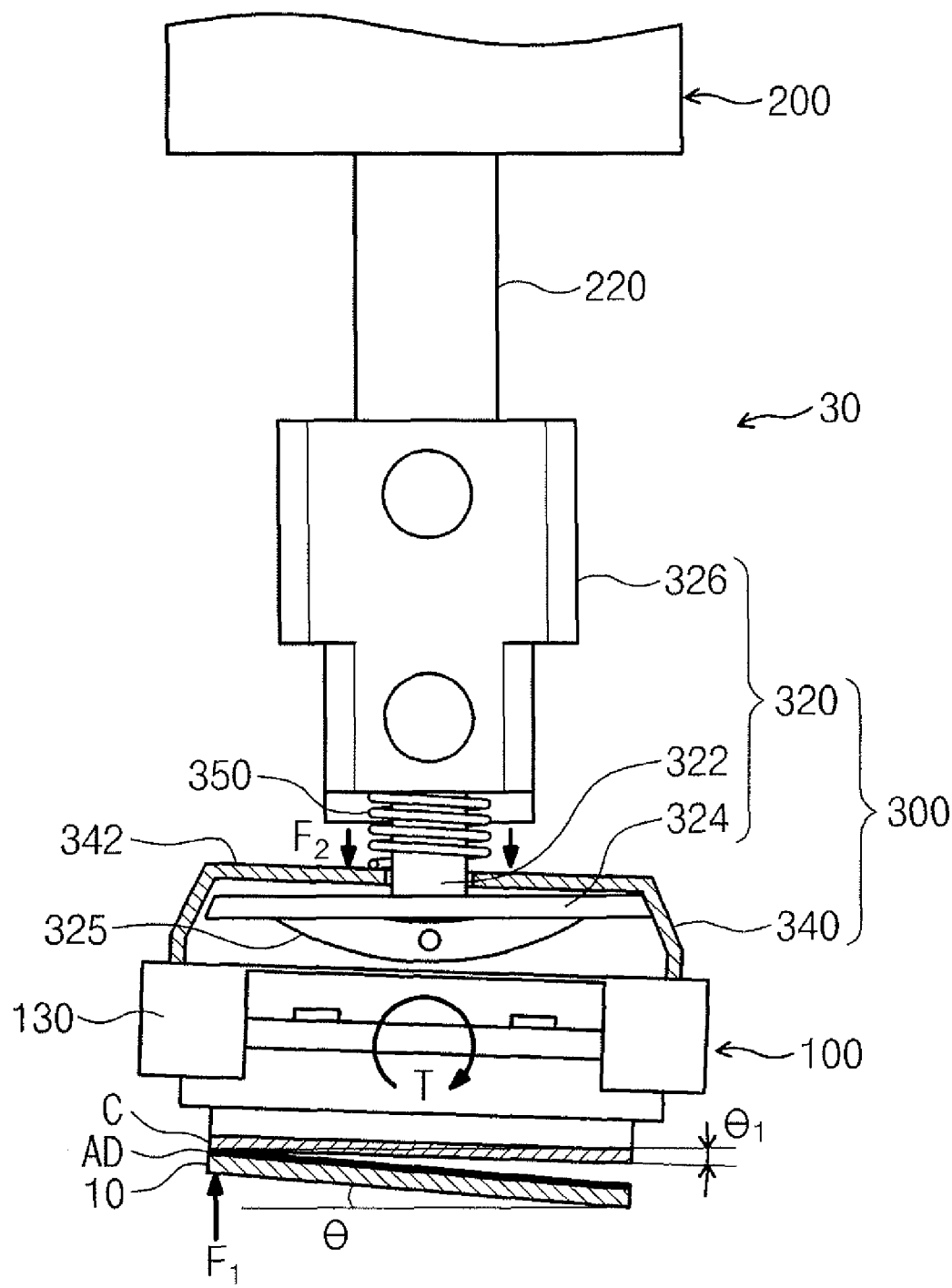

Referring to FIG. 5D, since the pressure member 324 is spaced apart from the connecting member 340 and the collet holder 130, the chip holding unit 100 can rotate by an arbitrary angle θ1 as shown in FIG. 5D. The chip holding unit 100 rotates by couple of forces T. A source generating the couple of forces T includes a reaction force F1 which the lead frame 10 applies to the semiconductor chip C due to a contact between the semiconductor chip C and the lead frame 10, and an elastic force F2 which the elasticity member 350 applies to an upper wall 342 of the connecting member 340.

The process shown in FIGS. 5C and 5D is repeated until the semiconductor chip C absorbed and fixed on the chip holding unit 100 maintains a parallel state to a lead frame 10, and is in surface contact with the lead frame 10. If the semiconductor chip C is in contact with the lead frame 10, the chip holding unit 100 can not rotate any longer.

Figure 5E:
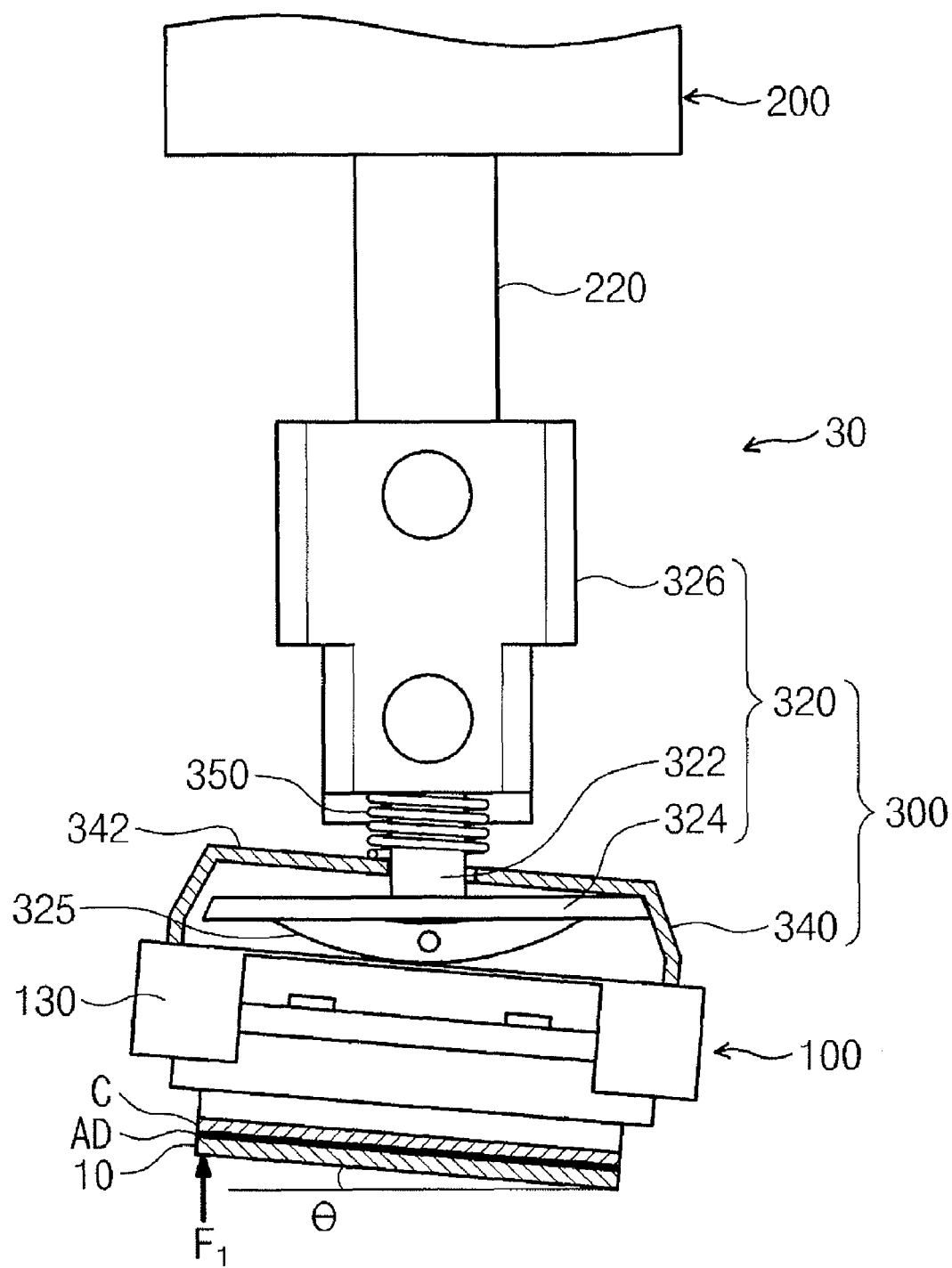

Referring to FIG. 5E, in this state, the bond head shaft 220 continues to apply boning load and the pressure member 324 presses a top surface of the collet holder 130 by the bonding load. Thus, the semiconductor chip C absorbed and fixed on the chip holding unit 100 presses the lead frame 10, so that the semiconductor chip C is bonded to the lead frame 10.

As described above, a semiconductor chip bonding apparatus according to the present general inventive concept may maintain parallelism between a semiconductor chip and the lead frame which inclines at an arbitrary angle, and perform a bonding process.

Since the semiconductor chip bonding apparatus according to the present general inventive concept may prevent a bonding load from being concentrated on any one portion of a semiconductor chip, a damage of a semiconductor chip may be minimized as compared with a case that bonding process is performed in a state that the semiconductor chip is not parallel with to the lead frame.

Since a parallel control between the lead frame and a semiconductor chip is performed during a bonding process, a separate parallel control time is not required when a collet is changed. Accordingly, an overall process productivity may be improved.

Figure 6:
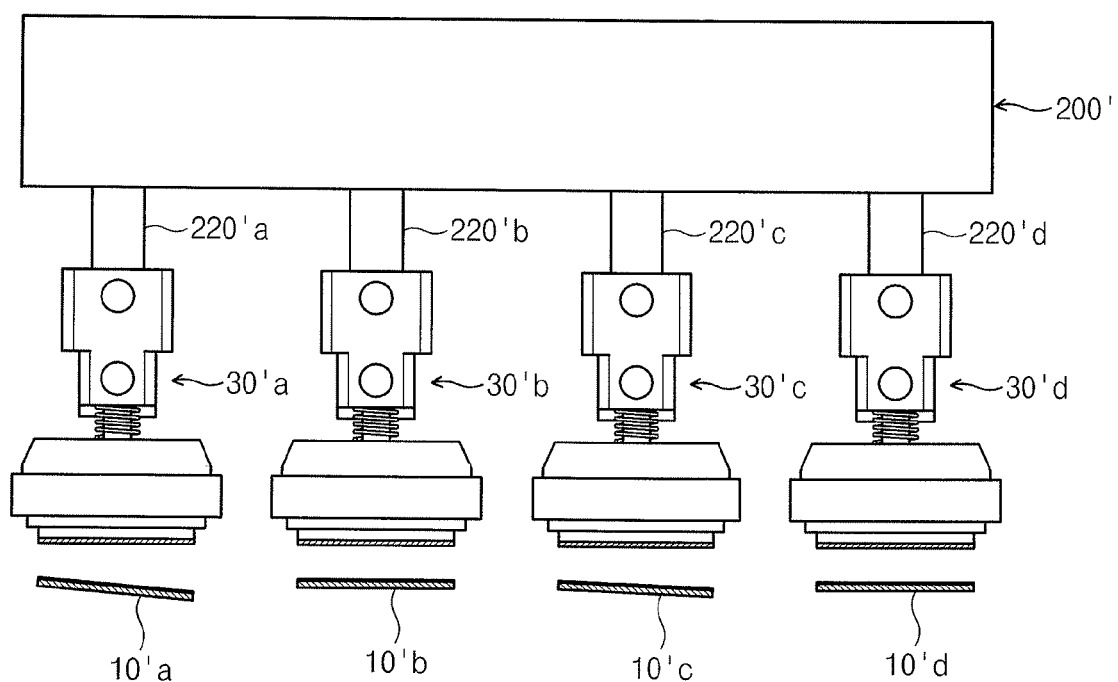
FIG. 6 is a schematic view illustrating a semiconductor chip bonding apparatus of a multi bond head shaft type.

As illustrated in FIG. 6, one bond head unit 200' may include a plurality of bond head shafts 220'a, 220'b, 220'c and 220'd. If semiconductor chip bonding apparatuses 30'a, 30'b, 30'c and 30'd having aforementioned structure are connected to respective bond head shafts 220'a, 220'b, 220'c and 220'd, processes of bonding semiconductor chips on a plurality of lead frames 10'a, 10'b, 10'c and 10'd which incline at different angles may be simultaneously performed.

In the above description, the semiconductor chip bonding apparatus which bonds a semiconductor chip on a lead frame is disclosed. But the present general inventive concept is not limited thereto. The semiconductor chip bonding apparatus according to the present general inventive concept may bond a semiconductor chip on a variety of substrates such as printed circuit board (PCB), etc.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor chip bonding apparatus, comprising:
a bond head unit to apply a bonding load;
a chip holding unit to hold a semiconductor chip to be attached to a substrate;
a balance control unit to transfer the bonding load of the bond head unit to the chip holding unit and to move the chip holding unit so that the chip holding unit is balanced to the substrate, the balance control unit having a load transfer member that is fixed with respect to the bond head unit and a connecting member connected to the chip holding unit to move the chip holding unit with respect to the bond head unit; and
an elastic member to bias the connecting member away from the bond head unit,
wherein the load transfer member is connected to the bond head unit and moves upward and downward to transfer the bonding load to the chip holding unit,
the connecting member connects the load transfer member to the chip holding unit such that the chip holding unit rotates relative to the load transfer member according to an upward and downward movement of the load transfer member, and
wherein the load transfer member comprises:
an axis member connected to the bond head unit to move upward and downward; and
a pressure member connected to a lower portion of the axis member and to be in contact with the chip holding unit to apply the bonding load according to an upward and downward movement of the axis member.

2. The apparatus of claim 1, wherein a side of the pressure member is in contact with the chip holding unit, and the side has a rounded shape which is convex downward.

3. The apparatus of claim 2, wherein:
the connecting member comprises:
an upper wall including a hole where the axis member is inserted, and
side walls to extend downward from an edge of the upper wall and to be coupled with the chip holding member; and
the pressure member coupled with a lower portion of the axis member is accommodated in a space formed by the upper wall and the side walls.

4. The apparatus of claim 3, wherein the space is provided so that the pressure member accommodated inside thereof moves upward and downward, and the connecting member rotates according to an upward and downward movement of the pressure member.

5. The apparatus of claim 4, wherein the elastic member supplies an elastic force so that the pressure element accommodated inside of the connecting element is in contact with an inner side of the upper wall of the connecting element and maintains the contact between the pressure element and the connecting element.

6. The apparatus of claim 1, further comprising:
an axis coupling member to couple a bond head shaft to apply the bonding load of the bond head unit with the axis member,
wherein the axis coupling member comprises a first hole where the bond head shaft and the axis member are inserted, and second holes which open to the first hole and through which the bond head shaft and the axis member are fixed by fastening elements.

7. The apparatus of claim 1, wherein the chip holding unit comprises:
a collet to absorb and fix the semiconductor chip;
a metal plate coupled with an upper portion of the collet; and
a collet holder having a magnetic substance to apply attraction to the plate.

8. A semiconductor chip bonding apparatus, comprising:
a bond head unit having a plurality of bond head shafts to apply a bonding load;
chip holding units to hold semiconductor chips to be attached to a substrate and correspond to the respective bond head shafts; and
balance control units to transfer the bonding load between the corresponding bond head shaft and the chip holding unit, and to move the chip holding unit so that the chip holding unit is balanced to the substrate, each balance control unit including a load transfer member connected to and fixed with respect to the bond head unit, a connecting member connected to a corresponding chip holding unit to move the chip holding unit relative to the bond head unit, and an elastic member to bias the connecting member away from the bond head unit,
wherein the chip holding unit comprises:
a collet to absorb and fix the semiconductor chip;
a metal plate coupled with an upper portion of the collet; and
a collet holder including a magnetic substance to apply attraction to the metal plate.

9. The apparatus of claim 8, wherein the bond head shafts are installed to be parallel at the bond head unit.

10. The apparatus of claim 8, wherein each load transfer member is connected to a respective bond head shaft of the bond head unit, to move upward and downward to transfer the bonding load to the chip holding unit, and
each connecting member connects a respective load transfer element to a corresponding chip holding unit such that the chip holding unit rotates relatively to the load transfer member according to an upward and downward movement of the load transfer element.

11. The apparatus of claim 10, wherein the load transfer member comprises:
an axis member to be connected to the bond head shaft to moves upward and downward; and
a pressure member to be connected to a lower portion of the axis element and to be in contact with the chip holding unit to apply the bonding load according to an upward and downward movement of the axis element.

12. The apparatus of claim 11, wherein a side of the pressure member is in contact with the chip holding unit, and the side has a rounded shape which is convex downward.

13. The apparatus of claim 12, wherein:
the connecting member comprises:
an upper wall including a hole to receive the axis member, and
side walls to extend downward from an edge of the upper wall and to be coupled with the chip holding member; and the pressure member coupled with a lower portion of the axis member is accommodated in a space formed by the upper wall and the side walls.

14. The apparatus of claim 13, wherein the hole is provided so that the pressure member accommodated inside thereof moves upward and downward, and the connecting member rotates according to an upward and downward movement of the pressure member.

15. The apparatus of claim 14, wherein the elastic member provides an elastic force so that the pressure member accommodated inside of the connecting member maintains a contact with an inside of an upper wall of the connecting member.

16. The apparatus of claim 11, further comprising:
an axis coupling member to couple the bond head shaft with the axis member,
wherein the axis coupling member includes a first hole to receive the bond head shaft and the axis member, and second holes which open to the first hole and through which the bond head shaft and the axis member are fixed by coupling elements.

17. A semiconductor chip bonding apparatus, comprising:
a bond head unit to apply a bonding load;
a chip holding unit to hold a semiconductor chip to be attached to a substrate;
a balance control unit to transfer the bonding load of the bond head unit to the chip holding unit and to move the chip holding unit so that the chip holding unit is balanced to the substrate, the balance control unit having a load transfer member that is fixed with respect to the bond head unit and a connecting member connected to the chip holding unit to move the chip holding unit with respect to the bond head unit; and
an elastic member to bias the connecting member away from the bond head unit,
wherein the chip holding unit comprises:
a collet to absorb and fix the semiconductor chip;
a metal plate coupled with an upper portion of the collet; and
a collet holder having a magnetic substance to apply attraction to the plate.

18. A semiconductor chip bonding apparatus, comprising:
a bond head unit having a plurality of bond head shafts to apply the bonding load;
chip holding units to hold semiconductor chips to be attached to a substrate and correspond to the respective bond head shafts; and
balance control units to transfer the bonding load between the corresponding bond head shaft and the chip holding unit, and to move the chip holding unit so that the chip holding unit is balanced to the substrate, each balance control unit including a load transfer member connected to and fixed with respect to the bond head, a connecting member connected to a corresponding chip holding unit to move the chip holding unit relative to the bond head, and an elastic member to bias the connecting member away from the bond head,
wherein each load transfer member is connected to a respective bond head shaft of the bond head unit, to move upward and downward to transfer the bonding load to the chip holding unit, and each connecting member connects a respective load transfer element to a corresponding chip holding unit such that the chip holding unit rotates reltively to the load transfer member according to an upward and downward movement of the load transfer element, and
wherein the load transfer member comprises:
an axis member to be connected to the bond head shaft to move upward and downward; and
a pressure member to be connected to a lower portion of the axis element and to be in contact with the chip holding unit to apply the bonding load according to an upward and downward movement of the axis element.

* * * * *